United States Patent
Ciubotaru

(10) Patent No.: US 7,043,220 B1
(45) Date of Patent: May 9, 2006

(54) IMAGE-REJECTION MIXER HAVING HIGH LINEARITY AND HIGH GAIN

(75) Inventor: Alexandru A. Ciubotaru, Palm Bay, FL (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 444 days.

(21) Appl. No.: 10/269,393

(22) Filed: Oct. 11, 2002

(51) Int. Cl.
*H04B 1/10* (2006.01)

(52) U.S. Cl. ............... 455/302; 455/313; 455/323; 327/113

(58) Field of Classification Search ........ 455/302, 455/307, 313, 323, 326, 334, 296, 63.1, 67.13; 327/100, 113, 119, 356
See application file for complete search history.

(56) References Cited

U.S. PATENT DOCUMENTS

| | | | | |
|---|---|---|---|---|
| 5,570,056 A | * | 10/1996 | Groe | 455/326 |
| 5,589,791 A | * | 12/1996 | Gilbert | 327/356 |
| 5,884,154 A | * | 3/1999 | Sano et al. | 327/113 |
| 6,285,865 B1 | | 9/2001 | Vorenkamp et al. | |
| 6,404,281 B1 | * | 6/2002 | Kobayashi | 330/85 |
| 6,438,365 B1 | * | 8/2002 | Balteanu | 455/323 |

OTHER PUBLICATIONS

Gingell, M.J., "Single Sideband Modulation using Sequence Asymmetric Polyphase Networks", Electrical Communication, 1973, pp. 21–25, vol. 48, Nos. 1 and 2.

Sansen, Willy M.C. et al., "An Integrated Wide–Band Variable–Gain Amplifier with Maximum Dynamic Range", IEEE Journal of Solid–State Circuits, Aug. 1974, pp. 159–166, vol. SC–9, No. 4.

Behbahani, Farbod et al., "CMOS Mixers and Polyphase Filters for Large Image Rejection", IEEE Journal of Solid–State Circuits, Jun. 2001, pp. 873–887, vol. 36, No. 6.

* cited by examiner

*Primary Examiner*—Quochien B. Vuong
(74) *Attorney, Agent, or Firm*—Blakely, Sokoloff, Taylor & Zafman LLP

(57) ABSTRACT

An integrated semiconductor image-rejection mixer having high linearity and high gain. In addition to the components of a classic image-rejection architecture, the present mixer has a high-frequency current-diverting stage that permits the operation of the output stage with high conversion gain and sufficient headroom for good linearity, even in cases where the supply voltage is relatively low (such as 3 V). The conversion gain of the mixer and its image-rejection performance can be changed by changing the load resistances and the elements of the output polyphase network, with minor effects on linearity and no change in power consumption or DC levels. The power consumption of the image-rejection mixer is low because no additional DC current is required for buffers or amplifier stages.

29 Claims, 9 Drawing Sheets

US 7,043,220 B1

IMAGE-REJECTION MIXER HAVING HIGH LINEARITY AND HIGH GAIN

BACKGROUND OF THE INVENTION

1. Field of the Invention

The present invention relates to the field of imager-ejection mixers.

2. Prior Art

When an RF (radio frequency) signal comprising a plurality of channels of information on different frequencies is down shifted to downshift the desired channel to a predetermined IF (intermediate frequency) frequency (actually a frequency range), one or more other channels may be downshifted to fall into the same IF frequency range. In particular, consider an RF frequency band being downshifted by mixing with another frequency $f_{LO}$. The mixing will provide sum and difference frequencies. For downshifting, the sum frequencies will be well above any frequency range of interest and easily filtered out of the resulting signal. For the difference frequencies however, when one or more channels in the RF signal are downshifted to the IF frequency range $f_{IF}$, one or more other channels in the RF signal that are $2f_{IF}$ away from the channels downshifted to the IF frequency range will appear in the -IF frequency range. Actually either of these IF frequency band signals could be the desired signal, depending on the application, with the other being commonly referred to as the image frequency or frequencies.

Once the image frequencies are combined with the desired signal, they cannot be separated, or the image frequencies eliminated. One approach for avoiding this is to bandpass filter the RF signal to eliminate the image frequencies from the RF signal prior to the mixer. This is difficult however, because of the sharp and variable frequency filters required. Another approach is to use what are referred to a imager-ejection mixers, which by their design, will pass the desired downshifted signals and automatically eliminate the image frequencies from the image-rejection mixer output.

Two classic architectures for image-rejection mixing are shown in FIG. 1 and FIG. 2 ("CMOS Mixers and Polyphase Filters for Large Image Rejection", F. Behbahani et al., IEEE Journal of Solid-State Circuits, Vol. 36, No. 6, June 2001). These mixers are composed of two mixing cells $MC_1$ AND $MC_2$, two 90° phase shifters and a local oscillator signal LO. In FIG. 1, the local oscillator signal LO is applied to both mixers $MC_1$ AND $MC_2$, but shifted 90° with respect to one of the two mixers. In FIG. 2, the local oscillator signal LO is applied to both mixers $MC_1$ AND $MC_2$ without phase shift, the RF signal is shifted 90° with respect to one of the two mixers. By proper selection of the direction of the phase shifts, the components of the IF OUTPUT in the two signal paths through the image-rejection mixer in the desired frequency band will add to create the IF OUTPUT, whereas the components of the IF OUTPUT in the two signal paths through the image-rejection mixer in the image frequency band will subtract, and therefore be eliminated from the IF OUTPUT.

Because image-rejection mixers must sometimes operate over relatively wide frequency ranges, the 90° phase shifters are commonly implemented in semiconductor integrated circuits using polyphase networks ("Single-Sideband Modulation Using Sequence Asymmetric Polyphase Network", M.J. Gingell, Electrical Communication, Vol. 48, No. 1 and 2, 1973). For high gain, the mixing cells are commonly implemented in such circuits using Gilbert-type mixers (U.S. Pat. No. 5,589,791).

Although both the polyphase networks and the Gilbert mixers have indisputable advantages as individual subcircuits, a direct implementation of an image-rejection mixer using these components has several drawbacks. An example is shown in FIG. 3, which shows a direct implementation of the diagram in FIG. 1. In FIG. 3, the RF stage is composed of npn transistors $Q_1$–$Q_4$ and degeneration resistors R. The inphase and quadrature local oscillators signals $V_{LOI}$ and $V_{LOQ}$ drive the mixers (mixing quads $MQ_1$ and $MQ_2$), and the output polyphase network has k sections consisting of resistors $R_{PN1}$–$R_{PNk}$ and capacitors $C_{PN1}$–$C_{PNk}$. Only one of the output voltages $V_{OUT1}$ and $V_{OUT2}$ is used as the output of the image-rejection mixer. In FIG. 3, $Q_1$, $Q_3$, $MQ_1$ and $Q_2$, $Q_4$, $MQ_2$ are Gilbert-type mixers (mixing cells $MC_1$ and $MC_2$ in FIG. 1). First of all, if high linearity (high third-order input-referred intermodulation point, or IIP3) is desired for the imager-ejection mixer, then degeneration must be used in the RF stage as shown, and that will limit the available headroom to the output stage (thus limiting the maximum achievable value for IIP3). The degeneration in the RF stage also reduces the conversion gain of the mixer. For bigger headroom and therefore better linearity (IIP3), the tail current source ($4_{I0}$) may be absent, as the tail node may be connected directly to ground or to a tank circuit (whose resonant frequency is the RF frequency). More importantly, however, because the output polyphase network and the load resistors are in the DC current path of the output stage, the output headroom is severely reduced especially in the case of low-voltage circuits with multiple-section polyphase networks, thereby reducing the linearity of the mixer. Increasing the output headroom is possible by reducing the load resistances and the resistances in the polyphase networks, but by doing this the conversion gain of the mixer is also reduced. Restoring the conversion gain is possible using additional gain stages at the output, with the drawback of having to use more supply current.

A possibility for avoiding the output headroom problem of the circuit in FIG. 3 is shown in FIG. 4, where the output polyphase network is taken out of the DC path of the quad collector currents and driven by two differential buffers $BUF_1$ and $BUF_2$. The drawback of this approach is that more supply current is needed for the buffers, especially for minimizing the linearity (IIP3) degradation that occurs at the buffer/polyphase network interface.

BRIEF SUMMARY OF THE INVENTION

An integrated semiconductor image-rejection mixer having high linearity and high gain is disclosed. In addition to the components of a classic image-rejection architecture, the present mixer has a high-frequency current-diverting stage that permits the operation of the output stage with high conversion gain and sufficient headroom for good linearity, even in cases where the supply voltage is relatively low (such as 3 V). The conversion gain of the mixer and its image-rejection performance can be changed by changing the load resistances and the elements of the output polyphase network, with minor effects on linearity and no change in power consumption or DC levels. The power consumption of the image-rejection mixer is low because no additional DC current is required for buffers or amplifier stages.

DETAILED DESCRIPTION OF THE PREFERRED EMBODIMENTS

In the description to follow, references may be made to local oscillator signals, or inphase and quadrature local oscillator signals, such as $L_{OI}$ and $L_{OQ}$ shown in the various Figures to be described herein. It is to be understood that such references are for purposes of convenience and not for purposes of limitation, as such local oscillator signals, by way of example, may be derived from an oscillator accompanying the image-rejection mixer, or may be made available locally from a remote source, such as over a wire connection or a wireless connection, or may even be recovered from the RF signal itself, all as is well known in the art. The source of the local oscillator signal is dependent on the application of the present invention, not the invention itself, and is simply to be distinguished from the RF signal itself.

Figure 1:
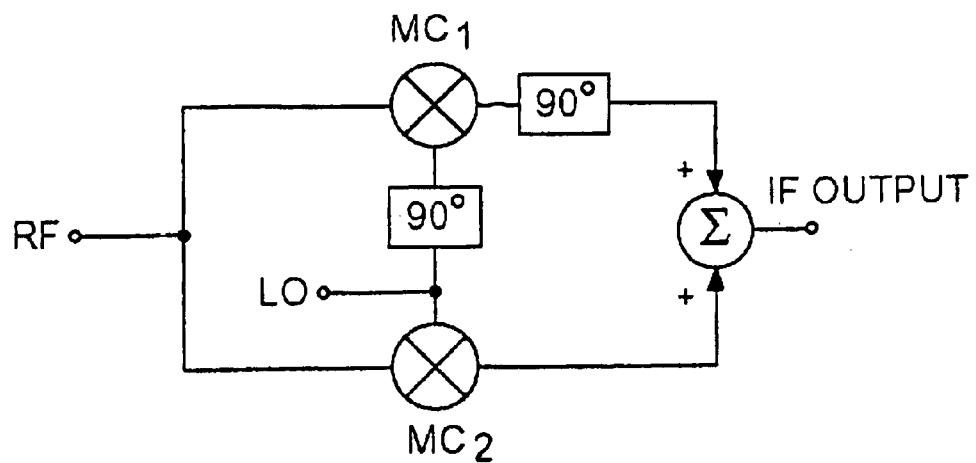
FIG. 1 is diagram illustrating a prior art image-rejection mixer architecture.
Figure 2:
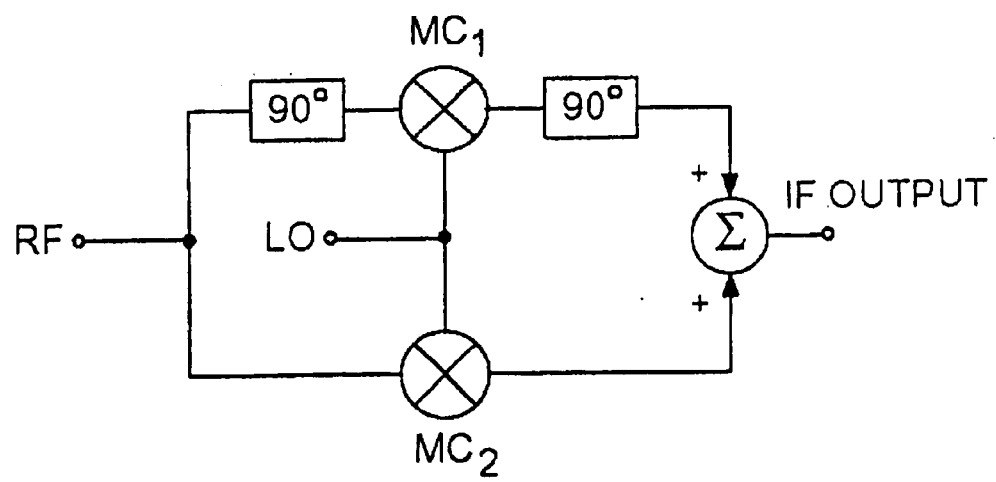
FIG. 2 is a diagram illustrating another prior art image-rejection mixer architecture.
Figure 3:
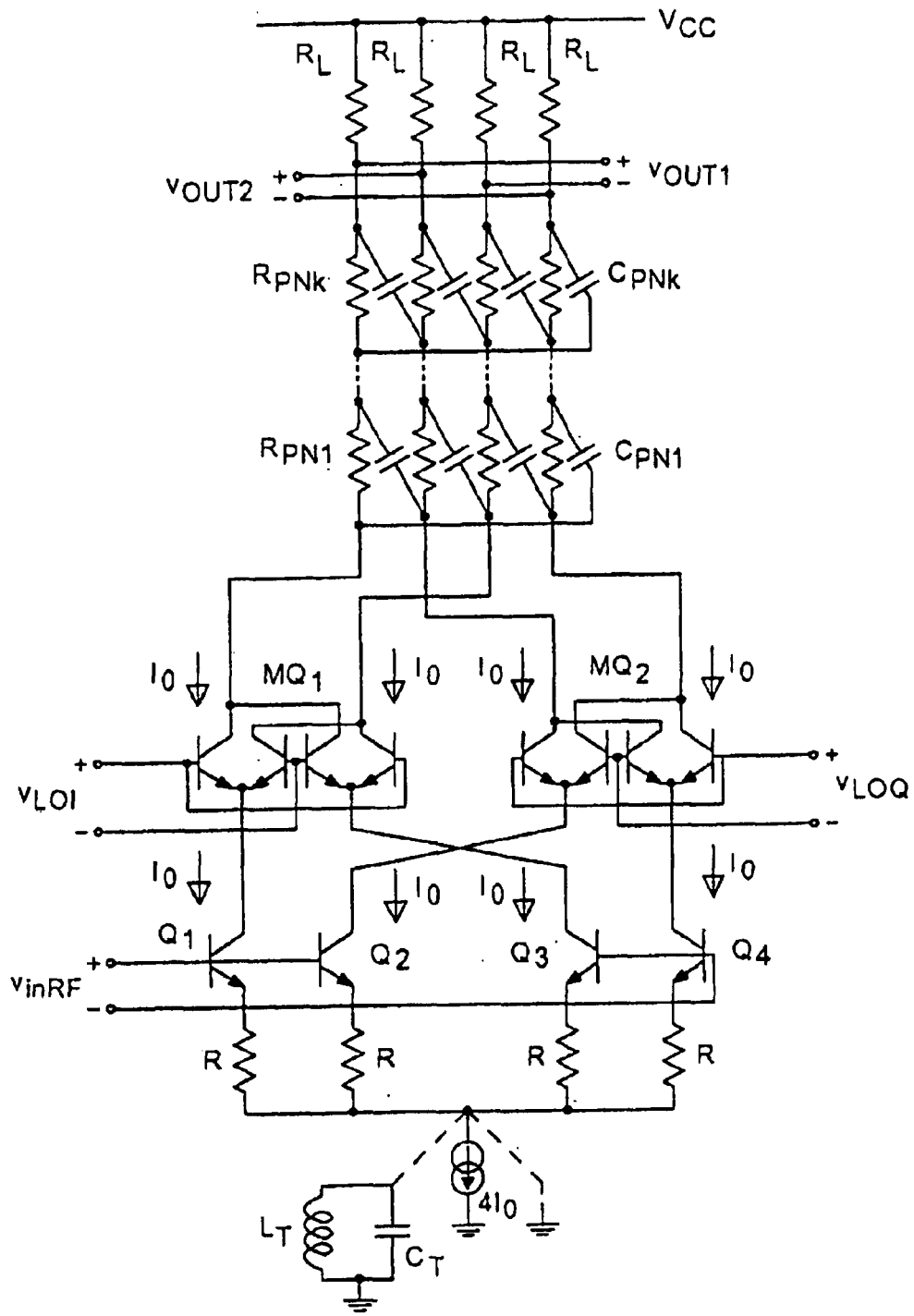
FIG. 3 is a direct implementation of the architecture of FIG. 2 using polyphase networks and Gilbert mixers.
Figure 4:
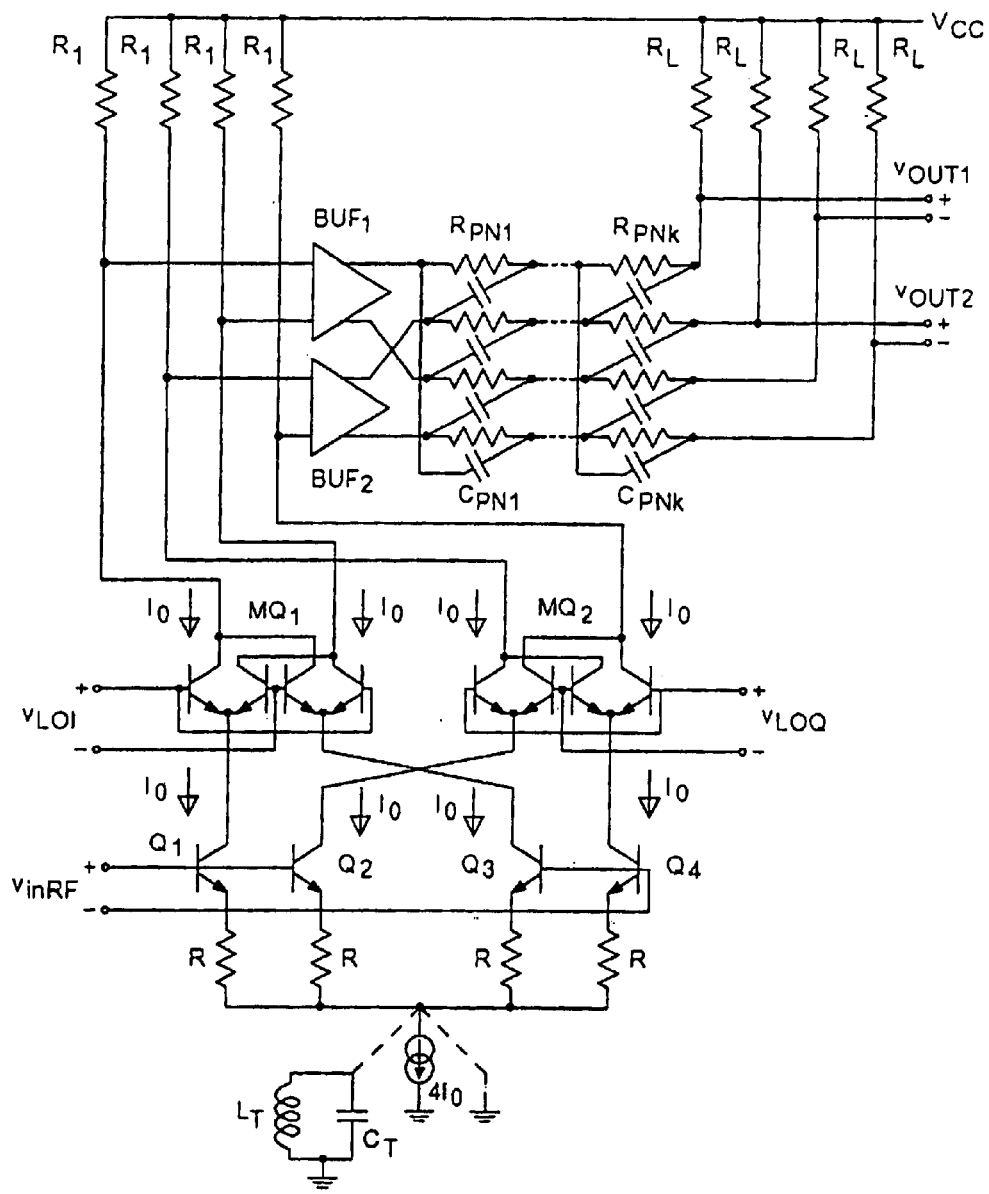
FIG. 4 is another implementation of the architecture in FIG. 2.
Figure 5:
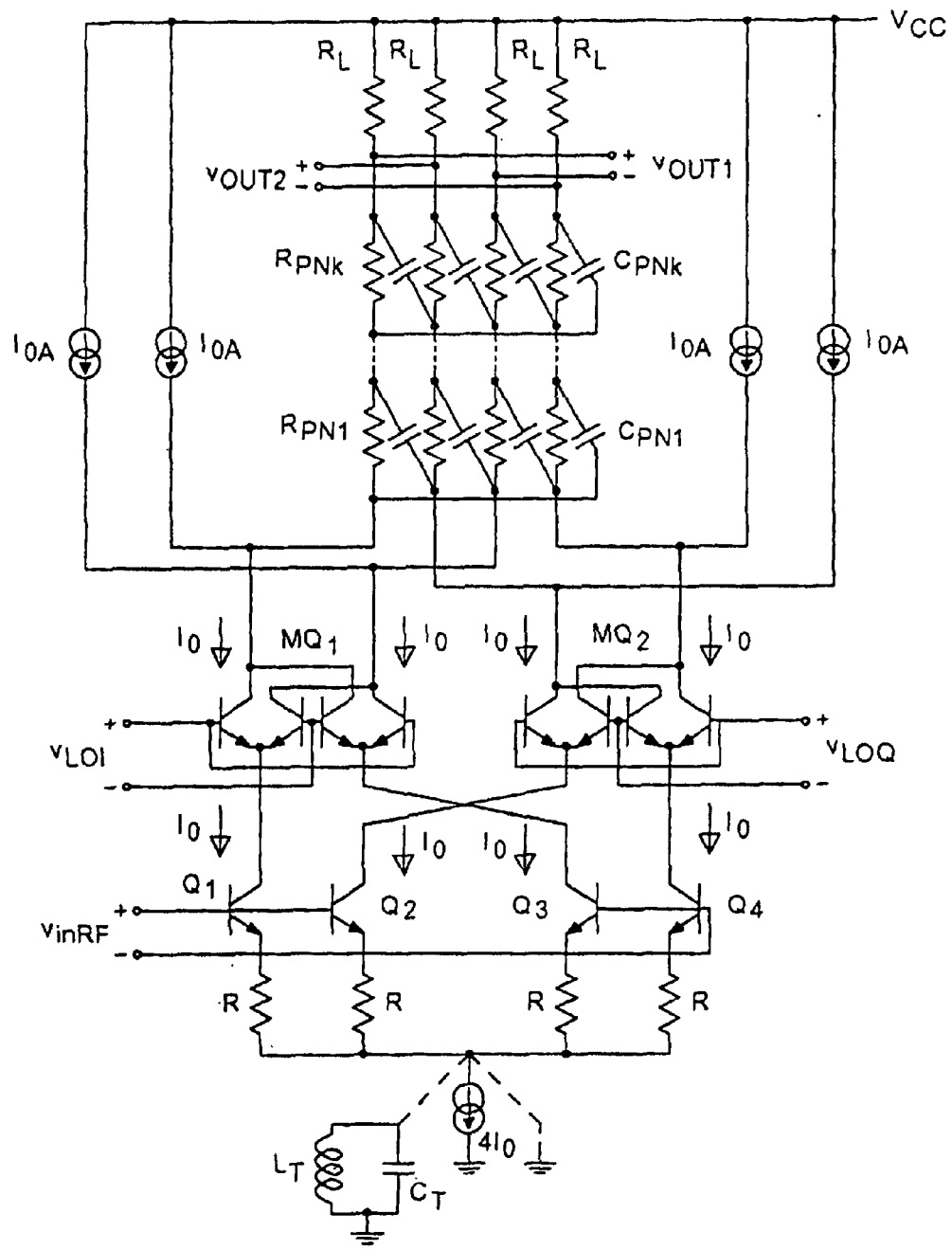
FIG. 5 is diagram illustrating a first embodiment of the present invention using output current sources for increasing the output headroom.

A first embodiment of the image-rejection mixer in accordance with the present invention is shown in FIG. 5. In this embodiment, the mixing cells (Gilbert mixers), the output polyphase network and the load resistors are connected, one on top of the other, as in FIGS. 3 and 4. In addition to the circuit shown in FIG. 3, the circuit of FIG. 5 has four identical current sources $I_{OA}$ whose main purpose is to prevent part of the DC currents flowing through the collectors of the mixing quads $MQ_1$ AND $MQ_2$ from flowing through the polyphase network $R_{PNI}$–$R_{PNk}$, $C_{PNI}$–$C_{PNk}$ and the load resistors $R_L$. In this way, even in cases where the supply voltage is relatively small (on the order of 3 V), the output stage of the image-rejection mixer can operate far from saturation and good linearity (IIP3) and high conversion gain can be achieved.

Figure 6:
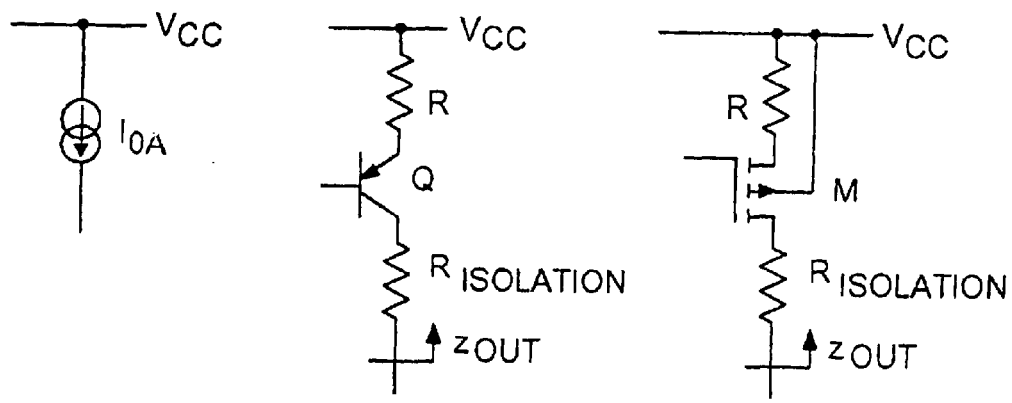
FIG. 6 is an implementation of the current sources in FIG. 5 using pnp or PMOS transistors.

The circuit of FIG. 5 can be used with good results in cases where the output frequency, or intermediate frequency (IF) of the mixer is less than several MHz or tens of MHz, and the current sources $I_{OA}$ can be implemented as shown in FIG. 6 by using active current-sourcing devices such as pnp or PMOS transistors. Although an optional isolation resistor RISOLATION can be used to increase the output impedance (see U.S. Pat. No. 6,404,281 B1), the capacitive pnp or PMOS parasitics significantly degrade the high-frequency performance of these current sources in integrated circuits, resulting in a very small conversion gain for the image-rejection mixer. Therefore, at IF frequencies on the order of several hundred MHz or higher, alternative techniques must be found for effectively diverting the DC current of the output stage and preserving the high conversion gain of the mixer.

Figure 7:
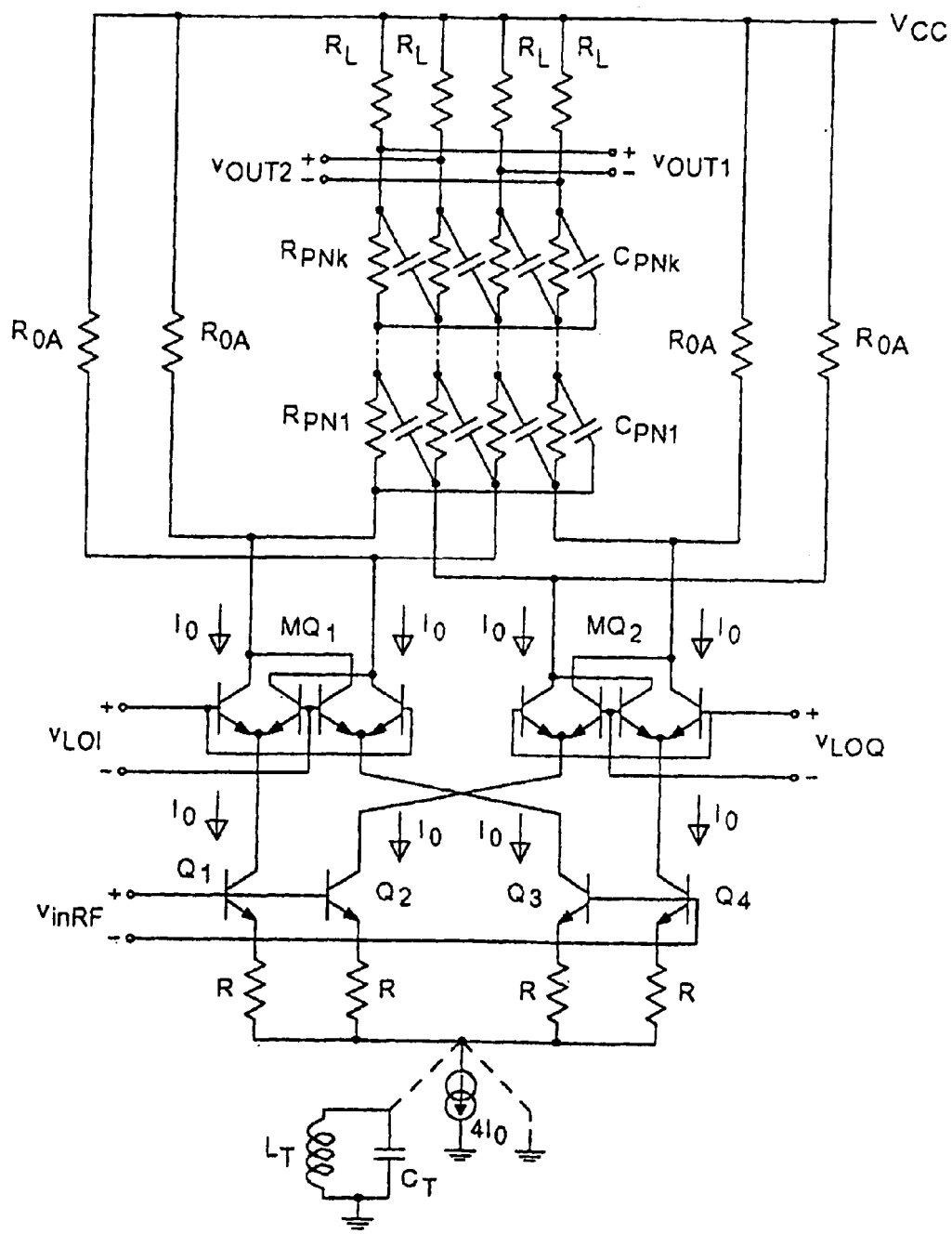
FIG. 7 is a diagram illustrating another embodiment of the present invention using resistors for increasing the output headroom.

FIG. 7 shows another embodiment of the invention in which the current sources in FIG. 5 are replaced by resistors $R_{OA}$. Resistors $R_{OA}$ do not exhibit the high-frequency degradation of the pnp or PMOS current sources, but they divert the signal as well as the DC current, resulting in a reduction in conversion gain.

Figure 8:
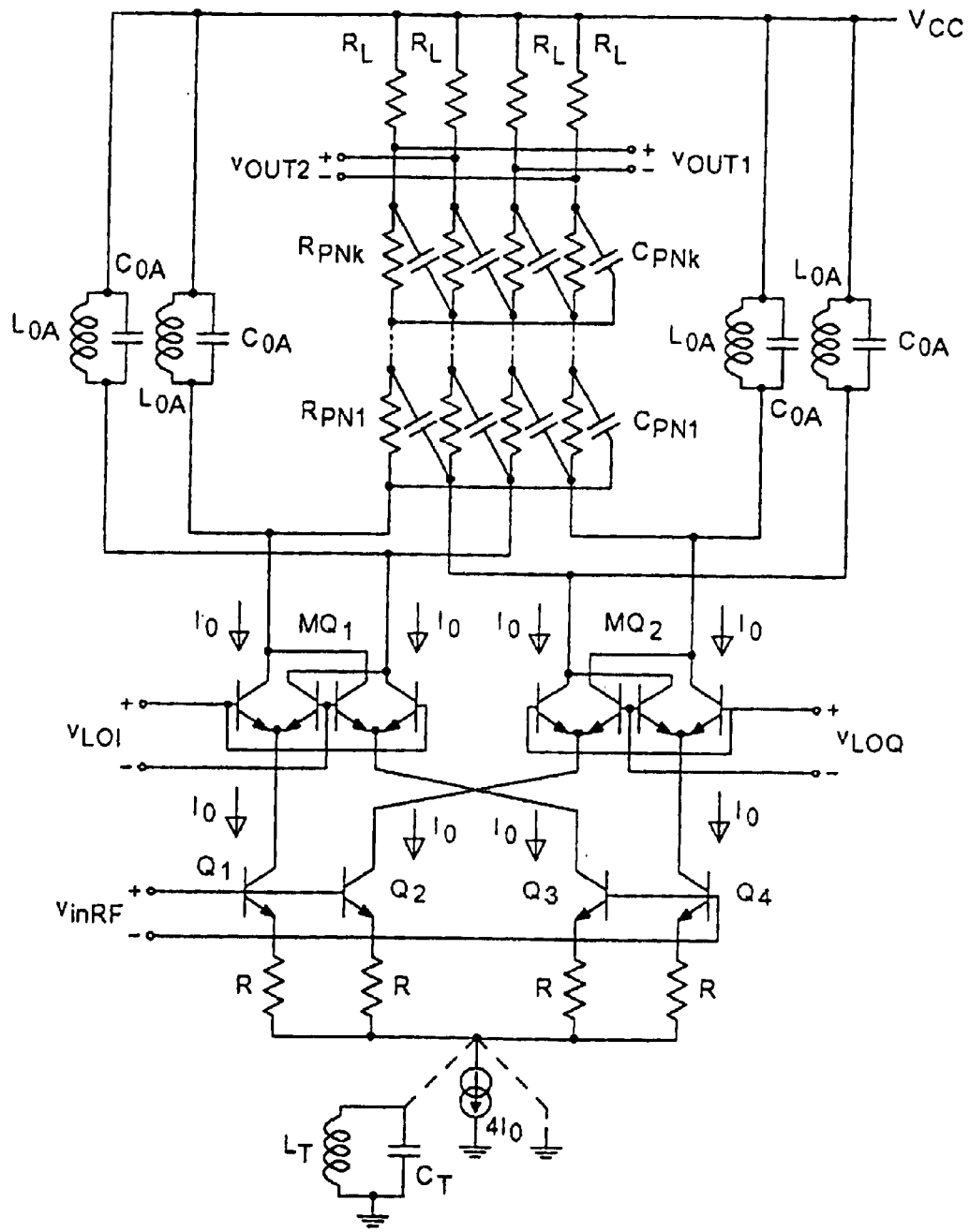
FIG. 8 is a diagram illustrating yet another embodiment of the present invention using tank circuits for increasing the output headroom.

FIG. 8 shows yet another embodiment of the invention, where the current sources $I_{OA}$ of FIG. 5 are replaced by tank circuits $L_{OA}$, $C_{OA}$ chosen such that their resonant frequency is the IF frequency. Although the headroom of the output stage is now the biggest (due to the inductors, the collector voltages of the mixing quads are practically equal to Vcc), the conversion gain of the image-rejection mixer is still relatively small at low IF frequencies because of the small quality factor of the integrated inductors. One alternative is to use external inductors $L_{OA}$ (with much better quality factors). Another drawback is the possibly impractical size of the inductors required at low IF frequencies.

Figure 9:
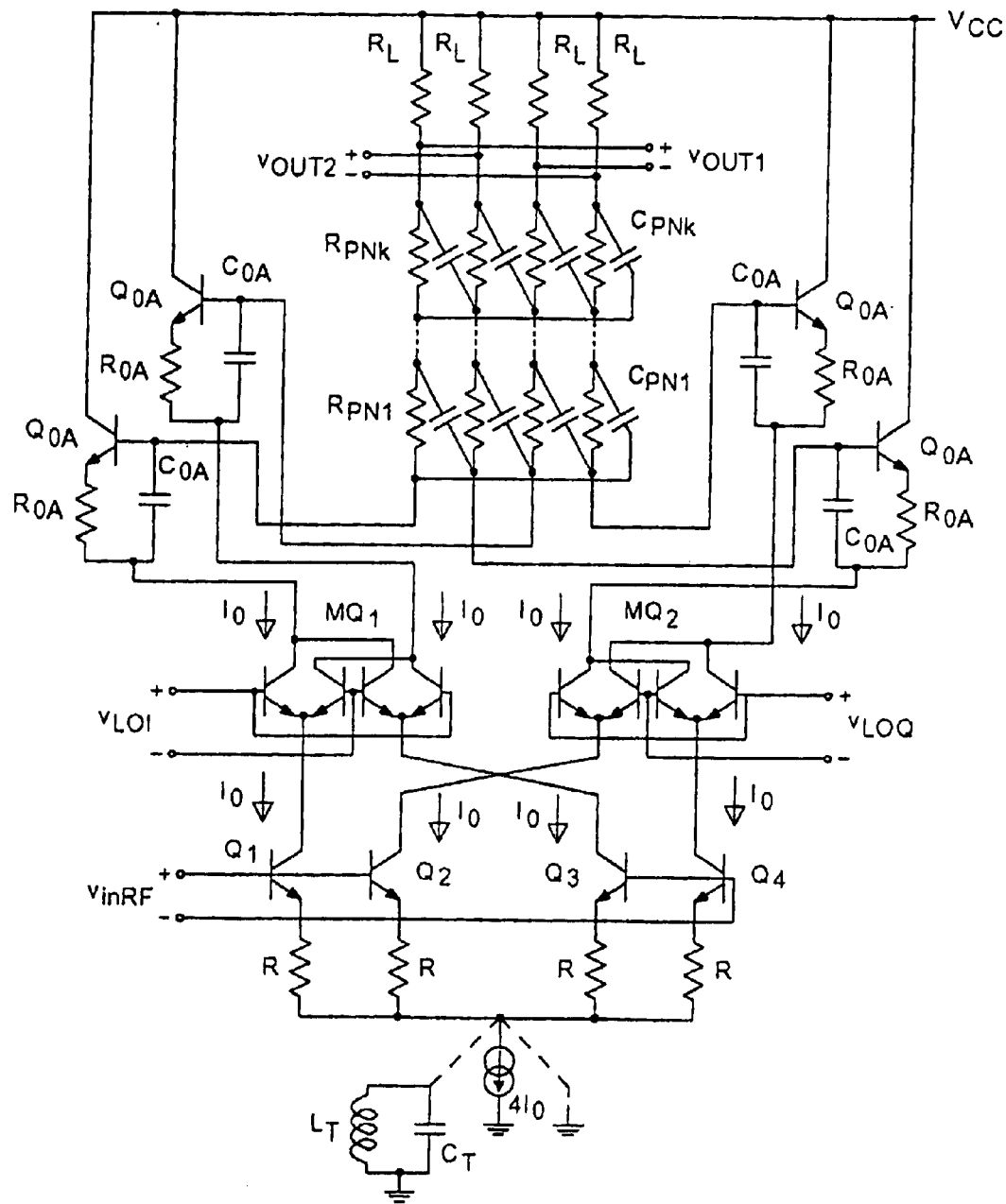
FIG. 9 is a diagram illustrating yet another embodiment of the present invention showing a DC current-diverting circuit using npn transistors.

FIG. 9 shows yet another embodiment of the invention, where the current sources $I_{OA}$ in FIG. 5 are implemented using npn devices $Q_{OA}$ optional degeneration resistors $R_{OA}$ (which may be absent or may be replaced with inductors), and bypass capacitors $C_{OA}$ Capacitors $C_{OA}$ are sufficiently large such that they can be considered short circuits (low impedance compared to the impedance of the multiphase network, such as, by way of example 10% or less of the impedance of the multiphase network, and more preferably 1% or less) at the frequency or frequency range of interest (IF) so that practically all of the output AC current flows through them and not though the $Q_{OA}$ devices. In order to reduce the size of capacitors $C_{OA}$ (several tens of pF are usually sufficient for IF frequencies on the order of several hundred MHz), degeneration resistors $R_{OA}$ can be employed, chosen such that $I_O R_{OA}$ is on the order of 100 mV (in order not to affect the output headroom). In this way, the DC currents flow through transistors $Q_{OA}$, and the AC output currents of the mixing quads $MQ_1$ and $MQ_2$ flow unattenuated into the output polyphase network and the mixer load. Only the base currents from the $Q_{OA}$ devices ($I_o/\beta$) now flow through the output polyphase network and the load resistance, causing a negligible reduction in the output headroom. The output headroom is determined by Vcc, one transistor $V_{BE}$, and the small DC voltage drop across $R_{OA}$ (no DC voltage drop if inductors are used in lieu of resistors), and is usually sufficient for ensuring superior linearity for the imager-ejection mixer. The conversion gain of the image-rejection mixer is high because practically the entire output current of the mixing quads $MQ_1$ and $MQ_2$ flows into the output polyphase network. Due to this current-diverting technique, the DC output levels of the mixer are practically at Vcc and are not a function of the load resistances $R_L$. The conversion gain of the image-rejection mixer can be changed by changing $R_L$ (the gain can be changed between the maximum value for very large $R_L$ and practically zero for $R_L = 0$) Improving the image-rejection performance of the mixer in a sufficiently wide IF band is a relatively easy task using the circuit of FIG. 9 because the output polyphase network can be designed independent of linearity considerations.

Figure 10:
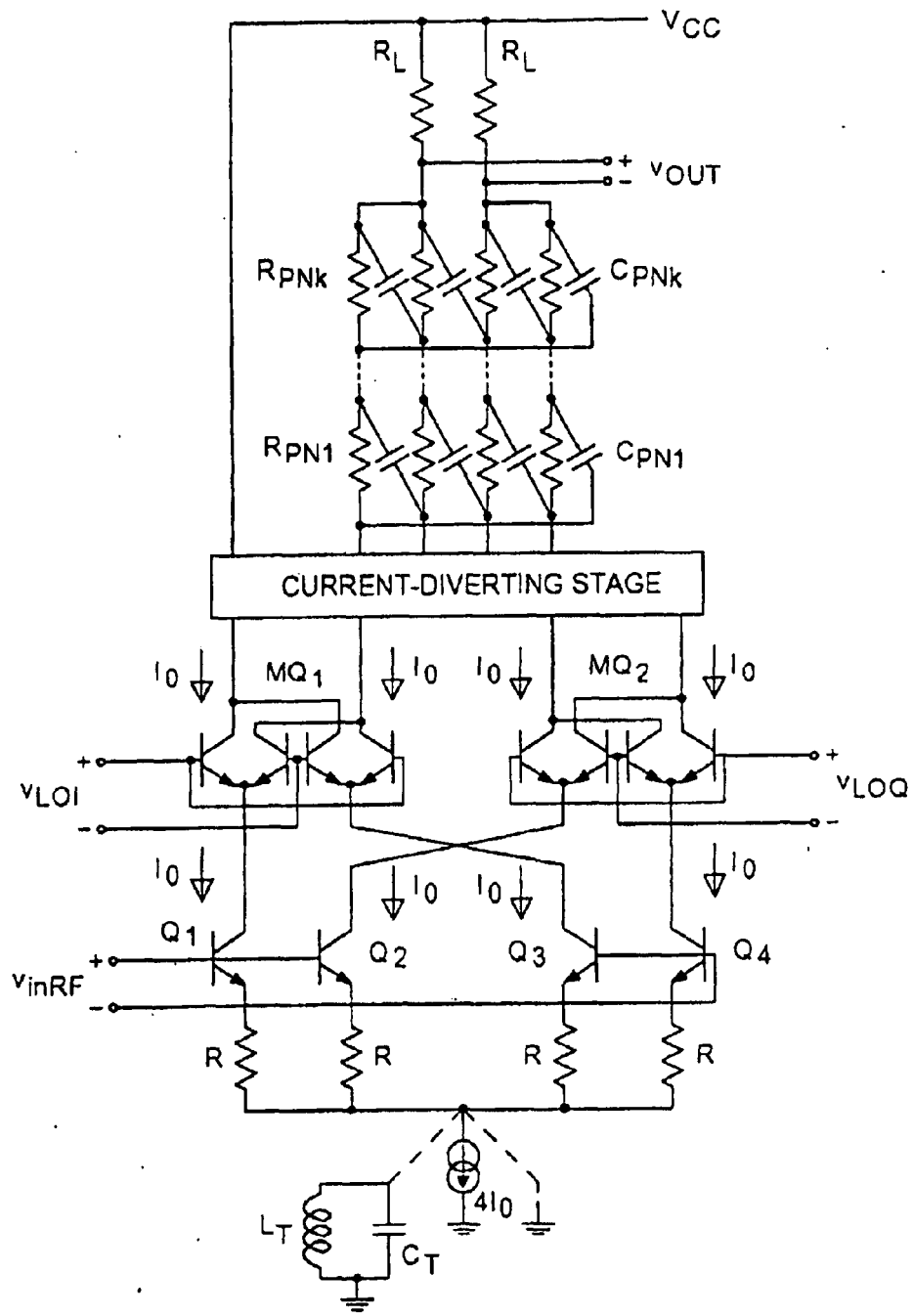
FIG. 10 is a diagram illustrating yet another embodiment of the present invention showing shorted pairwise outputs for the output polyphase network and a current-diverting stage similar to the current-diverting stages shown in FIGS. 5, 7, 8, and 9.

FIG. 10 shows yet another embodiment of the invention wherein the output polyphase network has shorted pairwise outputs for less sensitivity to load capacitance mismatch. The current-diverting stage consists either of the current sources $I_{OA}$ in FIG. 5, the resistors $R_{OA}$ in FIG. 7, the tank circuits $L_{OA}$, $C_{OA}$ in FIG. 8, or the npn transistors $Q_{OA}$ degeneration resistors $R_{OA}$ and bypass capacitors $C_{OA}$ in FIG. 9. As a minimum, the current-diverting stage should provide a DC current path or act as a DC current source from the power supply to the Gilbert mixers, and more preferably will provide such a path or source while presenting a high impedance path to IF frequencies from the Gilbert mixers to direct the IF frequency signal through the multiphase network.

The mixers of the present invention are well suited to use for downshifting an RF signal to provide an IF signal wherein the RF signal includes image frequency components, though of course may be used in other applications as well. Also while certain preferred embodiments of the present invention have been disclosed herein, such disclosure is only for purposes of understanding exemplary embodiments and not by way of limitation of the invention. It will be obvious to those skilled in the art that various changes in form and detail may be made in the invention without departing from the spirit and scope-of the invention as set out in the full scope of the following claims.

What is claimed is:

1. An image-rejection mixer comprising:
   first and second Gilbert mixers coupled to a first power supply terminal;
   a polyphase network coupled to the first and second Gilbert mixers;
   a plurality of load resistors coupled between a second power supply terminal and the polyphase network; and,
   a plurality of current sources coupled between the second power supply terminal and the first and second Gilbert mixers.

2. The image-rejection mixer of claim 1 wherein the plurality of current sources comprise active current sources.

3. The image-rejection mixer of claim 2 wherein the plurality of active current sources comprise pnp transistors.

4. The image-rejection mixer of claim 2 wherein the plurality of active current sources comprise PMOS transistors.

5. The image-rejection mixer of claim 2 wherein the plurality of active current sources each comprise a transistor having an emitter, a base and a collector, a capacitance and a resistance, the resistor being coupled to the emitter, the current path of the current being through the resistor and through the collector and the emitter of the transistor, the capacitor being coupled to the base of the transistor and the resistor.

6. The image-rejection mixer of claim 5 for down shifting an RF signal to an IF frequency range wherein the capacitors provide a low impedance in the IF frequency range.

7. The image-rejection mixer of claim 1 for down shifting an RF signal to an IF frequency range wherein the current sources provide a high impedance at frequencies in the IF frequency range.

8. The image-rejection mixer of claim 1 wherein the polyphase network has shorted pairwise outputs.

9. The image-rejection mixer of claim 1 wherein the plurality of current sources comprise tank circuits.

10. The image-rejection mixer of claim 1 wherein the first and second Gilbert mixers are coupled to the first power supply terminal through a tank circuit.

11. The image-rejection mixer of claim 10 for down shifting an RF signal to an IF frequency range wherein the resonant frequency of the tank circuit is the RF frequency.

12. The image-rejection mixer of claim 1 wherein the first and second Gilbert mixers include degeneration.

13. An image-rejection mixer comprising:
    first and second Gilbert mixers coupled to a first power supply terminal;
    a current-diverting stage coupled between the first and second Gilbert mixers and a second power supply terminal;
    a polyphase network coupled to the current-diverting stage; and,
    a plurality of load resistors coupled between a second power supply terminal and the polyphase network.

14. The image-rejection mixer of claim 13 wherein the current-diverting stage comprises resistors coupled between the first and second Gilbert mixers and the second power supply terminal.

15. The image-rejection mixer of claim 13 wherein the current-diverting stage comprises a plurality of active current sources coupled between the first and second Gilbert mixers and the second power supply terminal.

16. The image-rejection mixer of claim 15 wherein the plurality of active current sources comprise pnp transistors.

17. The image-rejection mixer of claim 15 wherein the plurality of active current sources comprise PMOS transistors.

18. The image-rejection mixer of claim 15 wherein the plurality of active current sources each comprise a transistor having an emitter, a base and a collector, a capacitance and a resistance, the resistor being coupled to the emitter, the current path of the current being through the resistor and through the collector and the emitter of the transistor, the capacitor being coupled to the base of the transistor and the resistor.

19. The image-rejection mixer of claim 18 for down shifting an RF signal to an IF frequency range wherein the capacitors provide a low impedance in the IF frequency range.

20. The image-rejection mixer of claim 13 for down shifting an RF signal to an IF frequency range wherein the current sources provide a high impedance at frequencies in the IF frequency range.

21. The image-rejection mixer of claim 13 wherein the polyphase network has shorted pairwise outputs.

22. The image-rejection mixer of claim 13 wherein the current-diverting stage comprise tank circuits.

23. The image-rejection mixer of claim 13 wherein the first and second Gilbert mixers are coupled to the first power supply terminal through a tank circuit.

24. The image-rejection mixer of claim 23 for down shifting an Rf signal to an IF frequency range wherein the resonant frequency of the tank circuit is the RF frequency.

25. The image-rejection mixer of claim 14 wherein the first and second Gilbert mixers include degeneration.

26. An image-rejection mixer comprising:
    first and second Gilbert mixers coupled to a first power supply terminal;
    a polyphase network;
    a plurality of load resistors coupled between a second power supply terminal and the polyphase network; and,
    a plurality of current sources coupled between the second power supply terminals and the first and second Gilbert mixers, each current source having a resistor, a capacitor, and a transistor having first and second terminals and a control terminal, the current flow between the first and second terminals of each transistor being controlled by the voltage between the control terminal and the first terminal of the respective transistor;

each transistor having its second terminal coupled to the second power supply terminal, its first terminal coupled to a first terminal of the respective resistor, and its control terminal coupled to a first terminal of the respective capacitor and to the multiphase network;

a second terminal of the respective resistor being coupled to a second terminal of the respective capacitor and to one of the Gilbert mixers.

27. The image-rejection mixer of claim 26 wherein the transistors are bipolar transistors.

28. The image-rejection mixer of claim 27 wherein the transistors are npn transistors.

29. The image-rejection mixer of claim 26 for down shifting an Rf signal to an IF frequency range wherein the capacitors have a low impedance at frequencies in the IF frequency range.

* * * * *